(12) United States Patent
Xia et al.

(10) Patent No.: US 11,631,800 B2
(45) Date of Patent: Apr. 18, 2023

(54) PIEZOELECTRIC MEMS DEVICES AND METHODS OF FORMING THEREOF

(71) Applicant: GLOBALFOUNDRIES Singapore Pte. Ltd., Singapore (SG)

(72) Inventors: Jia Jie Xia, Singapore (SG); Ranganathan Nagarajan, Singapore (SG); Bevita Kallupalathinkal Chandran, Singapore (SG); Miles Jacob Gehm, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 859 days.

(21) Appl. No.: 16/542,347

(22) Filed: Aug. 16, 2019

(65) Prior Publication Data
US 2021/0050506 A1  Feb. 18, 2021

(51) Int. Cl.
| | | |
|---|---|---|
| *H01L 41/053* | (2006.01) | |
| *H01L 41/047* | (2006.01) | |
| *H01L 41/08* | (2006.01) | |
| *H01L 41/083* | (2006.01) | |
| *H01L 41/113* | (2006.01) | |
| *H01L 41/277* | (2013.01) | |
| *H01L 41/293* | (2013.01) | |
| *H01L 41/319* | (2013.01) | |
| *H01L 41/332* | (2013.01) | |
| *H04R 17/02* | (2006.01) | |

(52) U.S. Cl.
CPC ........ *H01L 41/053* (2013.01); *H01L 41/0474* (2013.01); *H01L 41/0815* (2013.01); *H01L 41/0831* (2013.01); *H01L 41/1132* (2013.01); *H01L 41/1136* (2013.01); *H01L 41/1138* (2013.01); *H01L 41/277* (2013.01); *H01L 41/293* (2013.01); *H01L 41/319* (2013.01); *H01L 41/332* (2013.01); *H04R 17/02* (2013.01); *H04R 2201/003* (2013.01)

(58) Field of Classification Search
CPC ... H01L 41/053; H01L 41/277; H01L 41/293; H01L 41/319; H01L 41/332; H01L 41/0474; H01L 41/0815; H01L 41/0831; H01L 41/1132; H01L 41/1136; H01L 41/1138; H04R 17/02; H04R 2201/003
USPC .......................................................... 310/332
See application file for complete search history.

(56) References Cited

U.S. PATENT DOCUMENTS

| 8,511,163 B2 | 8/2013 | Mutharasan et al. |
| 8,531,088 B2 | 9/2013 | Grosh et al. |

(Continued)

*Primary Examiner* — Shawki S Ismail
*Assistant Examiner* — Monica Mata
(74) *Attorney, Agent, or Firm* — Viering Jentschura & Partner mbB

(57) ABSTRACT

In a non-limiting embodiment, a device may include a substrate, and a hybrid active structure disposed over the substrate. The hybrid active structure may include an anchor region and a free region. The hybrid active structure may be connected to the substrate at least at the anchor region. The anchor region may include at least a segment of a piezoelectric stack portion. The piezoelectric stack portion may include a first electrode layer, a piezoelectric layer over the first electrode layer, and a second electrode layer over the piezoelectric layer. The free region may include at least a segment of a mechanical portion. The piezoelectric stack portion may overlap the mechanical portion at edges of the piezoelectric stack portion.

20 Claims, 16 Drawing Sheets

(56) References Cited

U.S. PATENT DOCUMENTS

2015/0097468 A1\* 4/2015 Hajati ................ H01L 41/0825
310/334
2020/0382876 A1\* 12/2020 Cerini ................ H01L 41/0926

\* cited by examiner

PIEZOELECTRIC MEMS DEVICES AND METHODS OF FORMING THEREOF

TECHNICAL FIELD

The present disclosure relates generally to microelectromechanical system (MEMS) devices and methods of forming MEMS devices.

BACKGROUND

Piezoelectric MEMS devices such as a MEMS microphone, may employ a piezoelectric thin film to convert acoustic waves to electric signals. However, existing process integration and structure cannot meet high yield due to limitations in the capability of the deposition tool for forming the MEMS device. For example, due to limitations in the deposition process and film residue, the piezoelectric thin film has a high vertical stress gradient and poor stress uniformity as well as high deflection of the cantilever or membrane structure, which impacts device performance (e.g., sensitivity) significantly. In addition, cantilever/membrane in existing MEMS microphone which is formed of piezoelectric thin film and electrode film exhibits high deflection and mismatch due to non-uniform distribution of stress in the piezoelectric film and/or large membrane size. The membrane size may be reduced in an attempt to reduce deflection and mismatch which may facilitate on low frequency response, however the sensitivity of the MEMS microphone would be undesirably lowered, and when the sensitivity of the MEMS device is too low, it is not suitable for most applications. In some cases, a bi-layer piezoelectric film with different stress may be employed to mitigate the vertical stress gradient, however such design is not good enough, particularly in the case when cantilever/membrane length is longer.

From the foregoing discussion, it is desirable to provide MEMS devices having an active structure for sensing with high sensitivity and with reduced deflection.

SUMMARY

Embodiments generally relate to MEMS devices and methods for forming the MEMS devices. According to various non-limiting embodiments, a device may include a substrate, and a hybrid active structure disposed over the substrate. The hybrid active structure may include an anchor region and a free region. The hybrid active structure may be connected to the substrate at least at the anchor region. The anchor region may include at least a segment of a piezoelectric stack portion. The piezoelectric stack portion may include a first electrode layer, a piezoelectric layer over the first electrode layer, and a second electrode layer over the piezoelectric layer. The free region may include at least a segment of a mechanical portion. The piezoelectric stack portion may overlap the mechanical portion at edges of the piezoelectric stack portion.

According to various non-limiting embodiments, a method of forming the MEMS device is provided. The method may include providing a substrate, and arranging a hybrid active structure over the substrate. The hybrid active structure may include an anchor region and a free region. The hybrid active structure may be connected to the substrate at least at the anchor region. The anchor region may include at least a segment of a piezoelectric stack portion. The piezoelectric stack portion may include a first electrode layer, a piezoelectric layer over the first electrode layer, and a second electrode layer over the piezoelectric layer. The free region may include at least a segment of a mechanical portion. The piezoelectric stack portion may overlap the mechanical portion at edges of the piezoelectric stack portion.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following.

DETAILED DESCRIPTION

Figure 1:
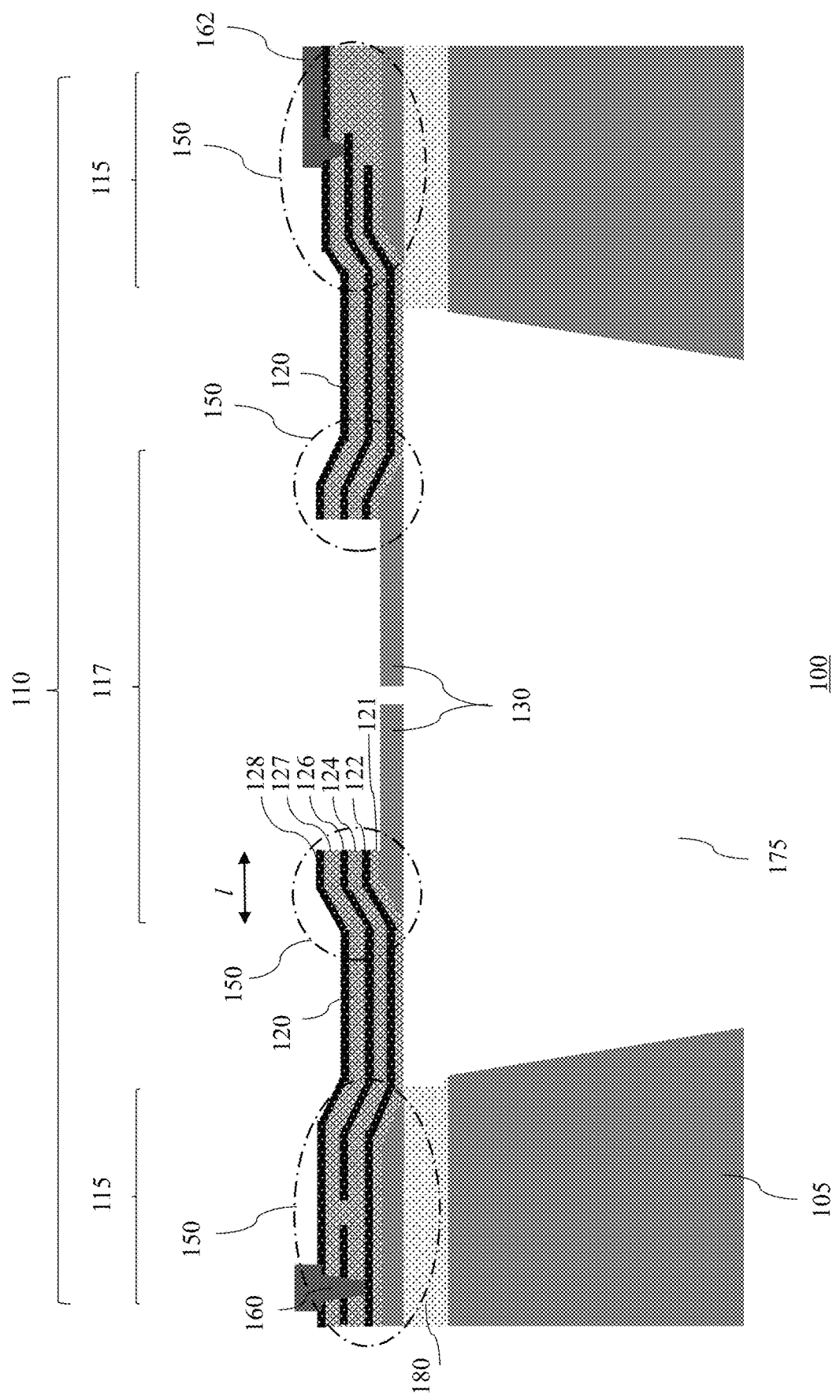
FIG. 1 shows a simplified cross-sectional view of an embodiment of a device.

The following detailed description refers to the accompanying drawings that show, by way of illustration, specific details and embodiments in which the embodiments may be practiced. These embodiments are described in sufficient detail to enable those skilled in the art to practice the embodiments. Other embodiments may be utilized and structural, logical, and electrical changes may be made without departing from the scope of the invention. The various embodiments are not necessarily mutually exclusive, as some embodiments can be combined with one or more other embodiments to form new embodiments.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic, or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Embodiments of the present disclosure generally relate to microelectromechanical (MEMS) devices. In various non-limiting embodiments, the MEMS device may include a hybrid active structure. The hybrid active structure may include a piezoelectric stack portion and a mechanical portion. The piezoelectric stack portion may include one or more piezoelectric layers, each of which may be disposed in between two electrode layers. The piezoelectric stack portion may overlap the mechanical portion at edges of the piezoelectric stack portion. For example, the hybrid active structure may have a cantilever (or beam) or membrane (or diaphragm) configuration. In various non-limiting embodiments, the MEMS device may include an anchor region which includes at least a segment of the piezoelectric stack portion, and a free region which includes at least a segment of the mechanical portion. For example, the piezoelectric stack portion may be arranged nearer to (and/or at) the anchor region, while the mechanical portion may be arranged nearer to (and/or at) the free region of the MEMS device. The MEMS device having the hybrid active structure, according to various embodiments of the present invention, allows effective sensing and generation of electrical signal by the piezoelectric stack portion (the piezoelectric stack portion is arranged nearer to the anchor region and stress is concentrated nearer to the anchor region), while reducing or eliminating deflection of the cantilever or membrane by providing at least a segment of the mechanical portion (e.g., non-piezoelectric material with low stress gradient) in the free region of the hybrid active structure without trade-off on device performance.

The hybrid active structure may be incorporated into or used with various types of MEMS devices, such as a microphone, PMUT, resonator, energy harvester, pressure sensor, accelerometer, in various non-limiting examples. The MEMS device may advantageously reduce deflection in the active structure having one or more of the piezoelectric layers (i.e., hybrid active structure), without trade-off on device performance. Further, the hybrid active structure may be able to maintain the same area of the cantilever/membrane in the MEMS device to achieve high sensitivity, and reduce deflection effectively which advantageously enables both high yield and high sensitivity of the device.

FIG. 1 shows a simplified cross-sectional view of an embodiment of a device 100. In various non-limiting embodiments, the device 100 may be, or include, a MEMS device. The MEMS device may include a substrate 105. The substrate 105 may be a semiconductor substrate, such as a silicon substrate. Other types of semiconductor substrates, such as a silicon germanium substrate, may also be used.

A hybrid active structure 110 may be disposed over the substrate 105. In various non-limiting embodiments, the hybrid active structure 110 may be used to generate electrical signals by piezoelectric effect. For example, the hybrid active structure may convert acoustic waves into electrical signals. For example, the hybrid active structure 110 may have a cantilever or membrane configuration. In various non-limiting embodiments, the hybrid active structure 110 may include a piezoelectric stack portion 120 and a mechanical portion 130. For example, the piezoelectric stack portion 120 may serve as a sensing part of the hybrid active structure 110 to generate electrical signal by piezoelectric effect while the mechanical portion 130 may provide an area for applying pressure or for tuning stiffness of the hybrid active structure 110.

The piezoelectric stack portion 120 may include one or more piezoelectric layers. Each piezoelectric layer of the one or more piezoelectric layers may be disposed between two electrode layers. In various non-limiting embodiments, the piezoelectric stack portion 120 may include a first electrode layer 122, a piezoelectric layer 124 over the first electrode layer 122, and a second electrode layer 126 over the piezoelectric layer 124. The first electrode layer 122, for example, may be a bottom electrode while the second electrode layer 126 may be a top electrode of the piezoelectric stack portion 120. In other embodiments, the piezoelectric stack portion 120 may include a further piezoelectric layer 127 over the second electrode layer 126, and a further electrode layer 128 over the further piezoelectric layer 127. For example, the first electrode layer 122 may be a bottom electrode, the second electrode layer 126 may be a middle electrode, and the further electrode layer 128 may be a top electrode of the piezoelectric stack portion 120. In yet other embodiments, the piezoelectric stack portion 120 may include any number of piezoelectric layers and electrode layers. In various non-limiting embodiments, the piezoelectric stack portion 120 may further include a seed piezoelectric layer 121. The seed piezoelectric layer 121 may be disposed under the first electrode layer 122. The seed piezoelectric layer 121, for example, may facilitate the electrode layer and device layer (e.g., piezoelectric layer) arranged over the seed piezoelectric layer 121 having a good crystal orientation.

In a non-limiting example, the one or more piezoelectric layers may be formed of a piezoelectric material, including but not limited to, aluminum nitride (AlN), scandium-doped AlN (ScAlN), germanium-doped AlN (GeAlN), titaniumdoped AlN (TiAlN), piezoelectric ceramic lead zirconate and titanate (PZT), zinc oxide (ZnO), or combinations thereof. In a non-limiting example, the electrode layers may be formed of an electrically conductive material, including but not limited to, molybdenum (Mo), platinum (Pt), titanium (Ti), or combinations thereof. As for the mechanical portion 130, it may be formed of a non-piezoelectric material such as silicon, polysilicon, silicon nitride, silicon carbide, polymers, in a non-limiting example. The non-piezoelectric material of the mechanical portion 130 may be chosen such that it is able to withstand a release etch process (e.g., hydrofluoric acid (HF) etching). For example, in the case an oxide layer is used as a sacrificial layer in the fabrication of the hybrid active structure 110 of the MEMS device, a non-oxide and non-piezoelectric material may be used for the mechanical portion 130. Additionally, the mechanical portion 130 may be formed of a non-piezoelectric material that exhibits a low stress gradient. This advantageously ensures reduced or no deflection of the mechanical portion 130 of the hybrid active structure 110 during operation.

As illustrated in FIG. 1, the hybrid active structure 110 may include an anchor region 115 and a free region 117. The hybrid active structure 110 may be connected to the substrate 105 at least at the anchor region 115. The anchor region 115 may include at least a segment of the piezoelectric stack portion 120. The free region 117 may include at least a segment of the mechanical portion 130. For example, the mechanical portion 130 may form a free end or center of a cantilever/membrane, in various non-limiting embodiments of the MEMS device.

As illustrated in FIG. 1, the piezoelectric stack portion 120 overlaps the mechanical portion 130. In various non-limiting embodiments, the piezoelectric stack portion 120 overlaps the mechanical portion 130 at edges of the piezoelectric stack portion 120. In various non-limiting embodiments, the piezoelectric stack portion 120 may abut (or contacts) the mechanical portion 130 in the areas of overlap or overlap region 150. For example, the piezoelectric stack portion 120 overlaps the mechanical portion 130 without an additional adhesive layer therebetween (e.g., without additional layer to the one or more piezoelectric layers and electrode layers). In various non-limiting embodiments, a piezoelectric layer (e.g., seed piezoelectric layer 121) of the piezoelectric stack portion 120 contacts the mechanical portion 130 in the areas of overlap between the piezoelectric stack portion 120 and the mechanical portion 130 (overlap region 150 of the piezoelectric stack portion 120 and the mechanical portion 130). In the case where a seed piezoelectric layer 121 is not arranged in the piezoelectric stack portion 120, an electrode layer (e.g., first electrode layer 122) of the piezoelectric stack portion 120 contacts the mechanical portion 130 in the areas of overlap between the piezoelectric stack portion 120 and the mechanical portion 130 (overlap region 150 of the piezoelectric stack portion 120 and the mechanical portion 130).

In various non-limiting embodiments, an edge of the mechanical portion 130 in the overlap region 150 of the hybrid active structure 110 may have a sloped portion with an angled/sloped profile and a substantially flat portion with a substantially flat profile. For example, the sloped portion with the angled profile may range from about 5° to about 45° with respect to the substantially flat portion. The piezoelectric stack portion 120 may have a profile which is conformal to the profile of the mechanical portion 130 in the overlap region 150. In various non-limiting embodiments, the piezoelectric stack portion 120 may overlap the mechanical portion 130 at the free region 117 by a predetermined length l. The predetermined length l may range from about 1 um to about 50 um, in a non-limiting example. Providing the mechanical portion 130 with the sloped portion having the angled profile allows good coverage of the piezoelectric stack portion 120 in the overlap region 150. This advantageously obviates mechanical reliability issue in the fabricated hybrid active structure 110 of the MEMS device.

In various non-limiting embodiments, the anchor region 115 may further include interconnects and bond pads. For example, one or more via contacts 160 may be disposed through the piezoelectric stack portion 120. The one or more via contacts 160 may provide electrical connection to the electrode layers in the piezoelectric stack portion 120. For example, the one or more via contacts 160 may electrically connect the first electrode layer and the second electrode layer 122 and 126. The one or more via contacts 160 may be electrically connected to one or more bond pads 162.

In various non-limiting embodiments, the MEMS device may further include a cavity 175 arranged under the hybrid active structure 110. In other embodiments, a cavity may not be provided under the hybrid active structure 110. In various non-limiting embodiments, the MEMS device may further include a sacrificial layer 180. For example, the sacrificial layer may be remaining sacrificial material after a release process of the hybrid active structure in the fabrication of the MEMS device. The sacrificial layer may be disposed between the hybrid active structure 110 and the substrate 105. The sacrificial layer may be an oxide layer, in a non-limiting example.

It is noted that stress of a cantilever/membrane of a MEMS device, for example, due to pressure/vibration may be concentrated nearer to the anchor region 115 of the cantilever/membrane, while the free region 117 does not contribute to generation of electrical signal by piezoelectric effect. In addition, deflections are higher at the free region of conventional cantilever/membrane structures, and particularly highest at the tip (e.g., centermost area) of the cantilever/membrane. Accordingly, the MEMS device having the hybrid active structure 110 according to various embodiments of the present invention allows effective sensing and generation of electrical signal by the piezoelectric stack portion 120 (since stress is concentrated nearer to the anchor region 115 and the piezoelectric stack portion 120 is arranged nearer to the anchor region 115), while reducing or eliminating deflection of the cantilever/membrane by providing at least a segment of the mechanical portion 130 (e.g., non-piezoelectric material with low stress gradient) in the free region 117 of the hybrid active structure 110. Further, deflection of the cantilever/membrane may be advantageously reduced while maintaining sensitivity and without reducing the size or length of the cantilever/membrane of the MEMS device. The MEMS device having the hybrid active structure 110 may be able to gain the same signal compared to MEMS device using conventional piezoelectric layer since stress is concentrated nearer to the anchor region and the hybrid active structure 110 has the piezoelectric stack portion 120 arranged nearer to and/or at the anchor region 115. Further, the overall deflection of the hybrid active structure 110 may be tunable by configuring the length and thickness of the mechanical portion 130 in the free region 117. For example, the length and thickness of the mechanical portion 130 in the free region 117 may be configured depending on the desired stiffness of the hybrid active structure 110 to meet different application requirements (e.g., various Acoustic Overload Point).

FIGS. 2A-2F show simplified top views of various exemplary embodiments of the device 100. The device 100 may include the hybrid active structure 110 as described with respect to FIG. 1.

Figure 2A:
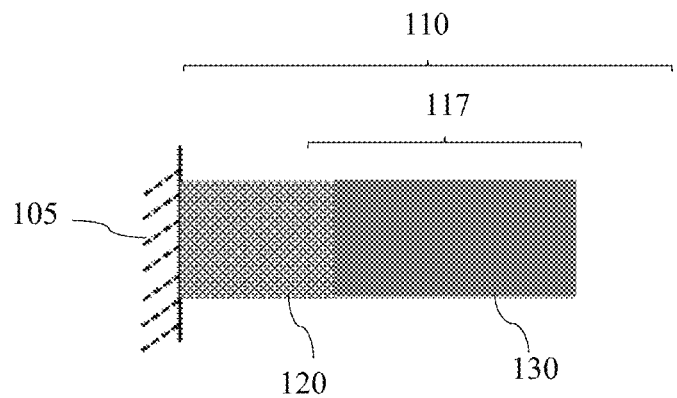
FIGS. 2A-2F show simplified top views of various exemplary embodiments of the device.
Figure 2B:
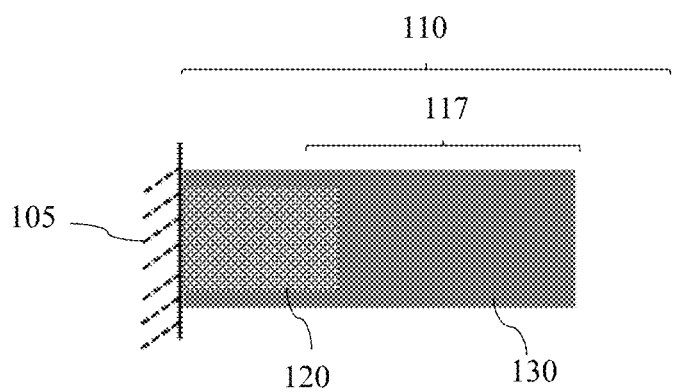
Figure 2C:
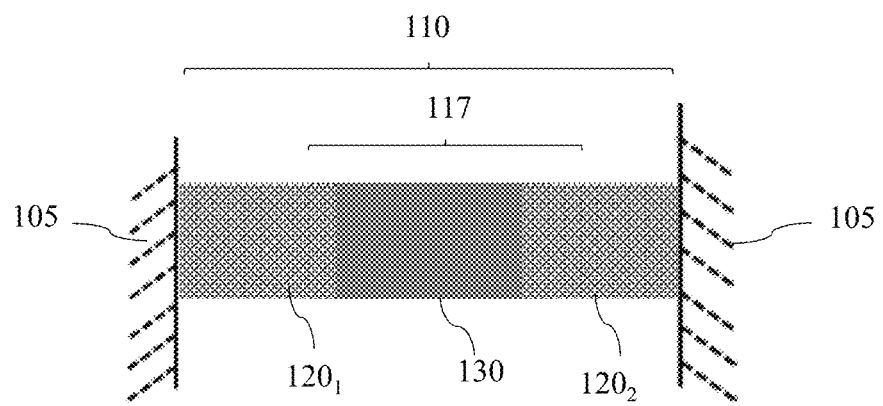
Figure 2D:
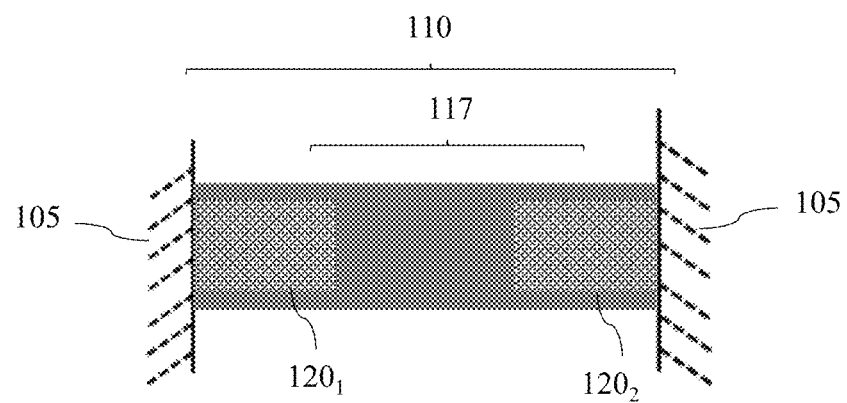

FIGS. 2A-2D show an exemplary top views of the hybrid active structure 110 with a cantilever configuration. According to various non-limiting embodiments, the hybrid active structure 110 may be configured to be a plurality of cantilevered beams (only one beam is illustrated). For example, each beam may be connected to the substrate 105 at least at one end or edge of the beam. Referring to FIGS. 2A-2B, the hybrid active structure 110 may be connected to the substrate 105 at one of its end. As illustrated, the mechanical portion 130 forms a free end of the cantilevered beam. In other words, a free region 117 of the beam may be formed by the mechanical portion 130. Referring to FIGS. 2C-2D, the hybrid active structure 110 may be connected to the substrate 105 at both of ends. For example, the piezoelectric stack portion includes a first piezoelectric stack portion $120_1$ and a second piezoelectric stack portion $120_2$ respectively anchored or connected to the substrate 105. At least a segment of the mechanical portion 130 may be disposed in between the first piezoelectric stack portion $120_1$ and the second piezoelectric stack portion $120_2$. In various non-limiting embodiments, the sidewalls of the piezoelectric stack portion 120 and the mechanical portion 130 may be aligned, as illustrated in FIGS. 2A and 2C. In other embodiments, the mechanical portion 130 may further surround sidewalls of the piezoelectric stack portion 120 or extend over the sidewalls of the piezoelectric stack portion 120 (e.g., the mechanical portion 130 having a higher width relative to the piezoelectric stack portion 120), as illustrated in FIGS. 2B and 2D.

Figure 2E:
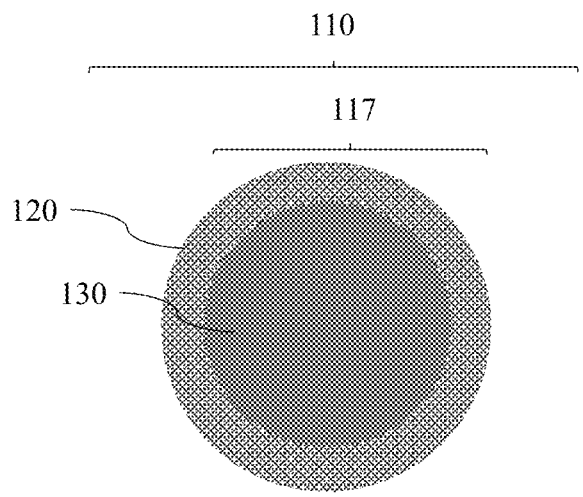
Figure 2F:
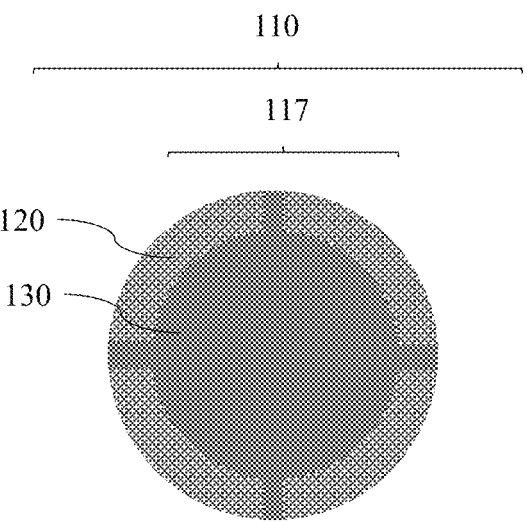

FIGS. 2E-2F show an exemplary top views of the hybrid active structure 110 with a membrane configuration. As illustrated, the mechanical portion 130 forms a center of the membrane. The piezoelectric stack portion 120 surrounds the mechanical portion 130. For example, the piezoelectric stack portion 120 may be arranged at the edge of the hybrid active structure 110 (e.g., anchor region) while the mechanical portion 130 may be arranged at the center of the hybrid active structure 110 (e.g., free region 117). Referring to FIG. 2F, the piezoelectric stack portion 120 may not completely surround the mechanical portion 130. In a non-limiting embodiment, the hybrid active structure 110 forms a diaphragm of an acoustic sensor.

FIGS. 3A-3M show simplified cross-sectional views of an embodiment of a process 300 for forming a device. According to various non-limiting embodiments, the process forms a hybrid active structure of a MEMS device. The device formed, for example, is similar or the same as that shown and described in FIG. 1 and FIGS. 2A-2F. As such, common elements may not be described or described in detail.

In various non-limiting embodiments, a wafer or substrate 105 may be provided. The substrate may be a semiconductor substrate, such as a silicon substrate. Other types of semiconductor substrates, such as a silicon germanium substrate, may also be used. In various non-limiting embodiments, a sacrificial layer 307 may be formed on the substrate 105. The sacrificial layer 307 may be formed by performing thermal oxidation on the substrate 105, in a non-limiting embodiment. In various non-limiting embodiments, the sacrificial layer 307 may be an oxide layer, such as silicon oxide, in a non-limiting example. The sacrificial layer 307 may have a thickness ranging from about 0.1 um to about 5 um, in a non-limiting example.

Figure 3A:
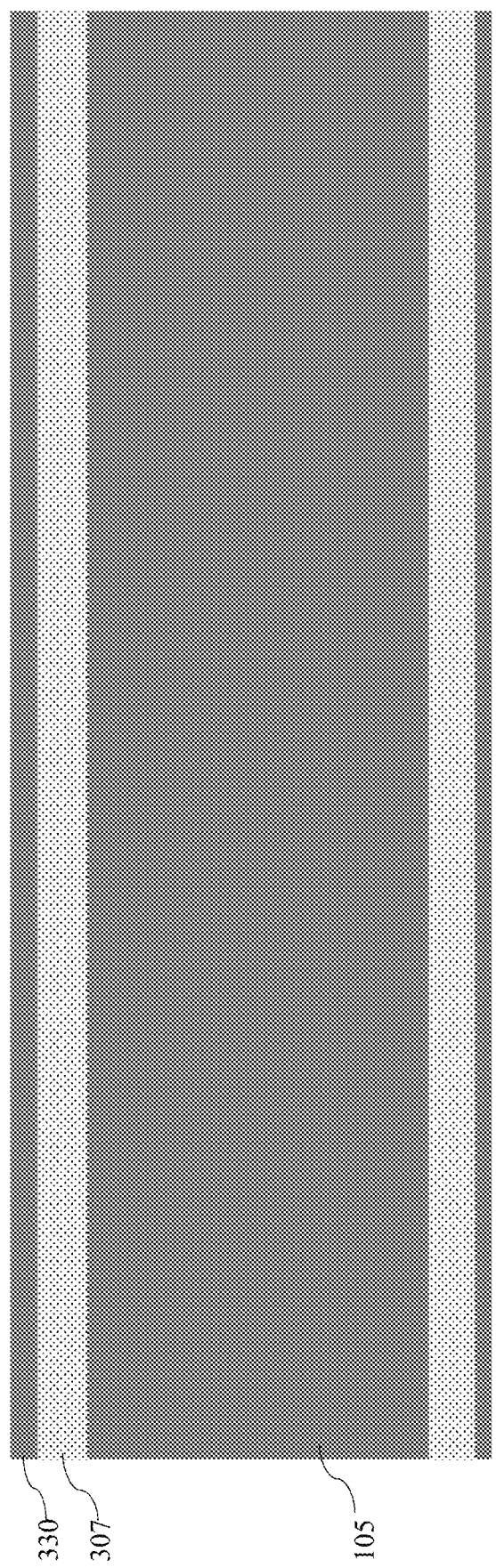
FIGS. 3A-3M show simplified cross-sectional views of an embodiment of a process for forming a device.

A hybrid active structure may be arranged (or formed) over the substrate 105. Referring to FIG. 3A, a non-piezoelectric layer 330 may be deposited over the substrate 105 for forming a mechanical portion of the hybrid active structure. In various non-limiting embodiments, the non-piezoelectric layer 330 may be a non-piezoelectric material as described above. The non-piezoelectric layer 330 may be formed over the substrate 105 by deposition such as physical vapor deposition, in a non-limiting example. The non-piezoelectric layer 330 may have a thickness ranging from about 0.1 um to about 5 um in a non-limiting example. An anneal may be performed to reduce the stress gradient in the non-piezoelectric layer 330. In other embodiments, the substrate 105 may be a crystalline-on-insulator (COI) substrate, such as a silicon-on-insulator (SOI) substrate, in a non-limiting example. A COI substrate includes a surface crystalline layer separated from a bulk crystalline by an insulator layer. The insulator layer, for example, may be formed of a dielectric insulating material, such as silicon oxide. In the case a COI substrate is used, the insulator layer of the COI substrate may be used as the sacrificial layer 307, while the surface crystalline layer may be used as the non-piezoelectric layer 330. An anneal need not be performed in the case the COI substrate is used.

Figure 3B:
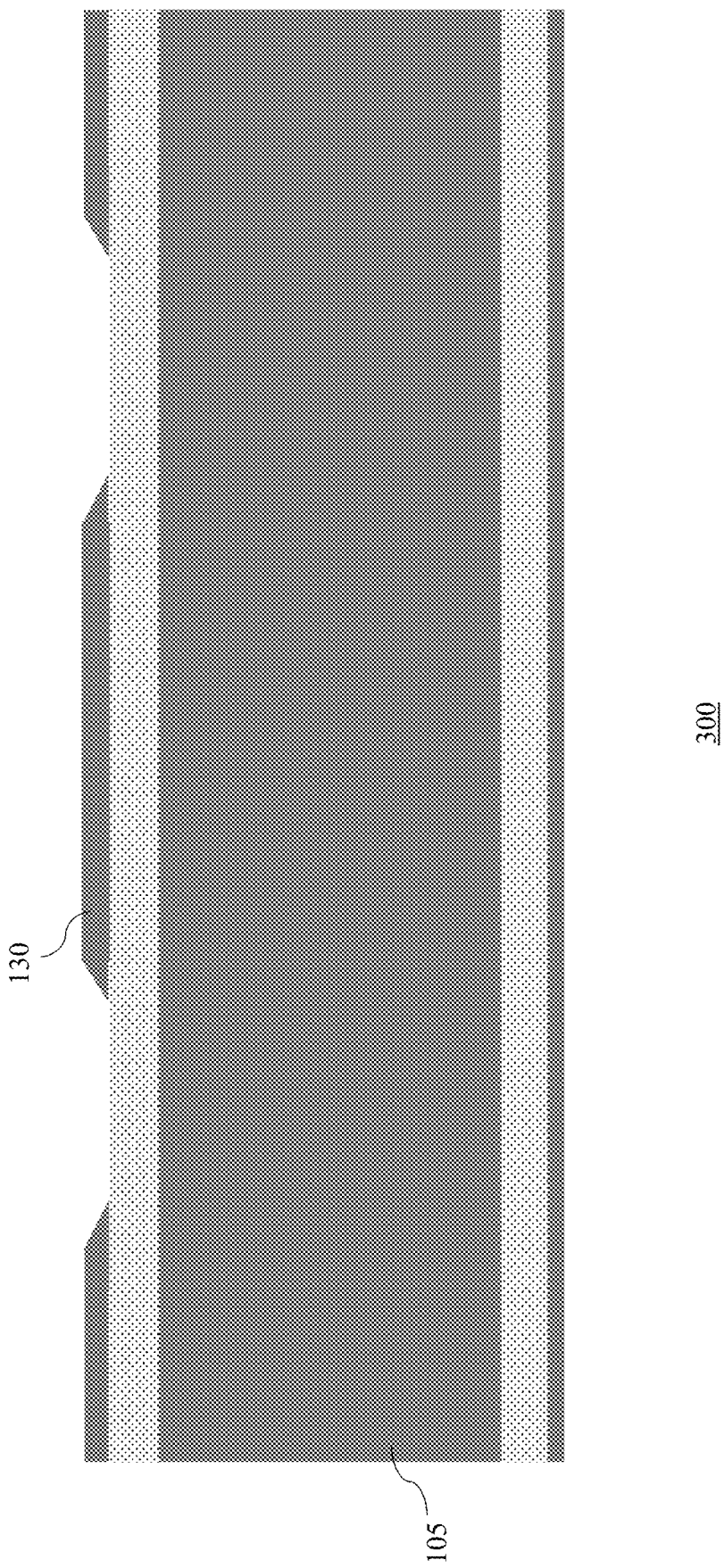

The non-piezoelectric layer may be patterned to form the mechanical portion 130 of the hybrid active structure. As illustrated in FIG. 3B, the non-piezoelectric layer 330 may be patterned to form sloped portions and substantially flat portions. For example, a sloped portion may have an angled profile and a substantially flat portion may have a substantially flat profile. The non-piezoelectric layer may be patterned by mask and etch techniques, in a non-limiting embodiment. For example, the non-piezoelectric layer may be patterned such that the sloped portion may have an angled profile (or sloped profile) ranging from about 5° to about 45° with respect to a substantially planar (or flat) top surface of the non-piezoelectric layer. The sacrificial layer 307 may serve as an etch stop layer for patterning the non-piezoelectric layer.

Figure 3C:
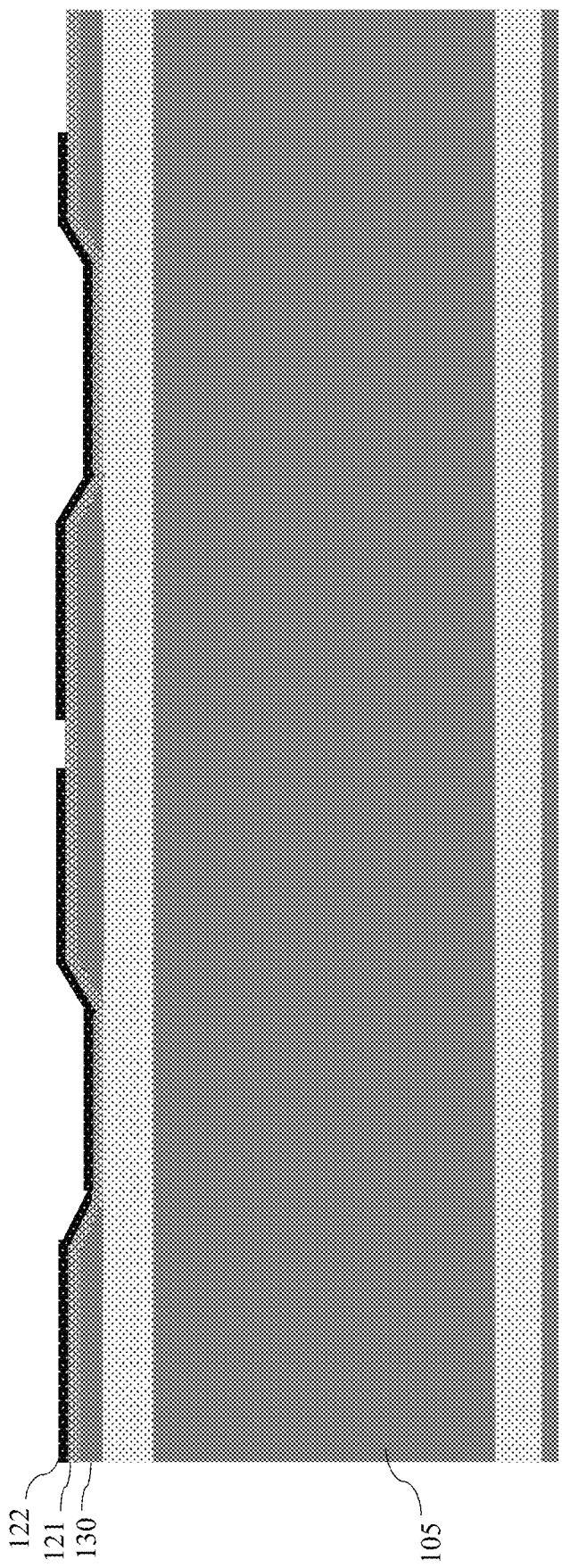

A piezoelectric stack portion may be formed over the patterned mechanical portion 130 of the hybrid active structure. FIGS. 3C-3F illustrate various exemplary piezoelectric and electrode layers deposited over the substrate 105 for forming the piezoelectric stack portion. Referring to FIG. 3C, a first electrode layer 122 may be deposited over the substrate 105. The first electrode layer 122 may have a thickness ranging from about 20 nm to about 200 nm, in a non-limiting example. The first electrode layer 122 may be patterned, for example, using mask and etch techniques to form a bottom electrode of the piezoelectric stack portion. In some embodiments, a seed piezoelectric layer 121 may be deposited over the substrate 105 prior to deposition of the first electrode layer 122. The seed piezoelectric layer 121 may have a thickness ranging from about 20 nm to about 200 nm, in a non-limiting example. In other embodiments, the seed piezoelectric layer 121 may not be required for forming the piezoelectric stack portion.

Figure 3D:
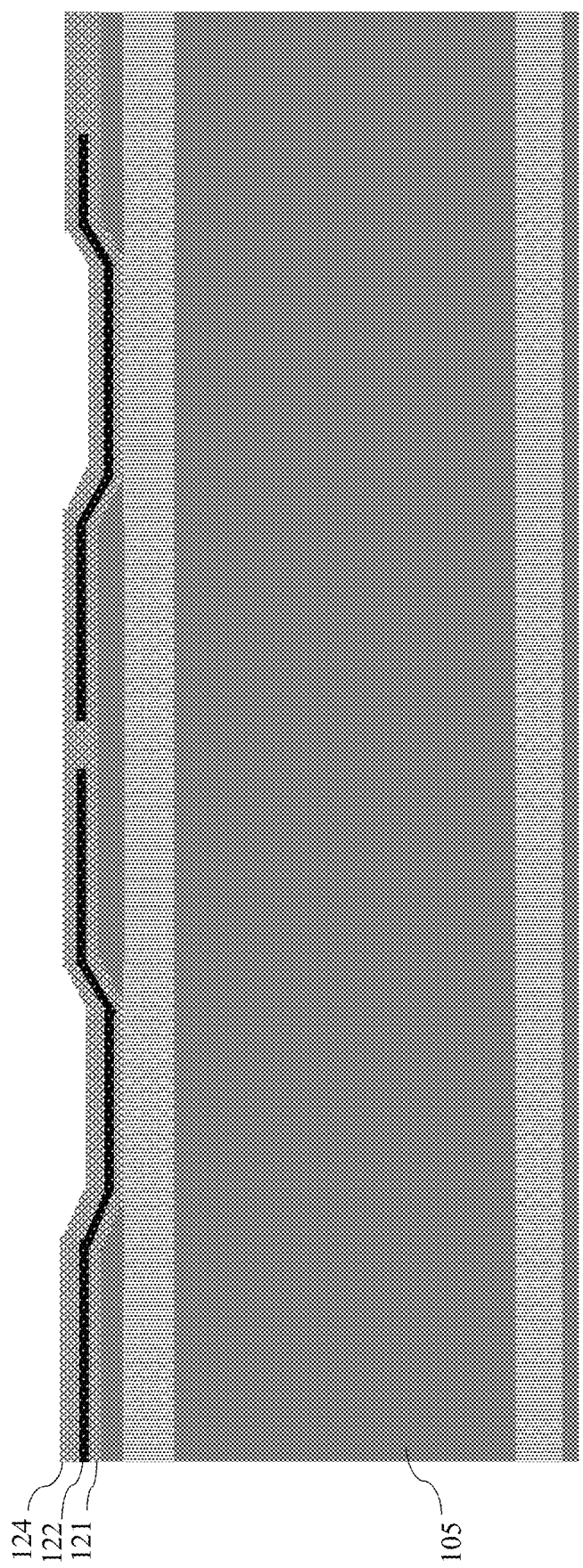
Figure 3E:
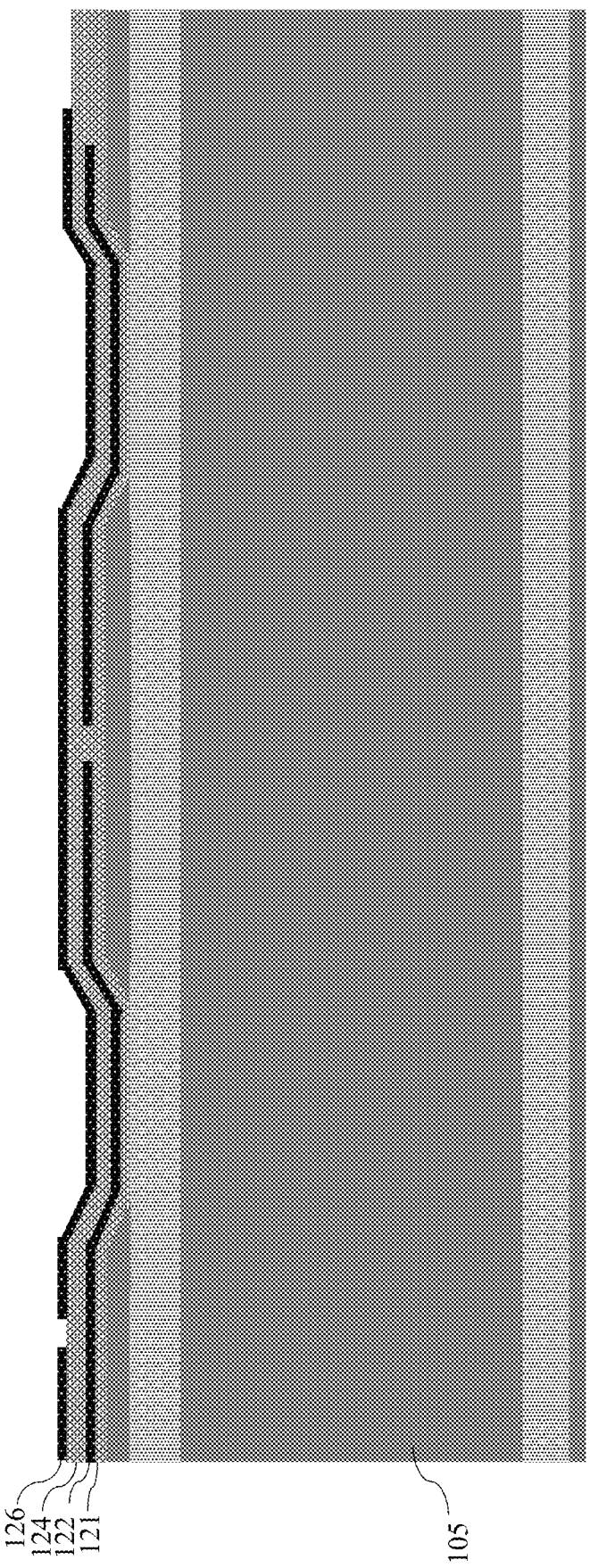
Figure 3F:
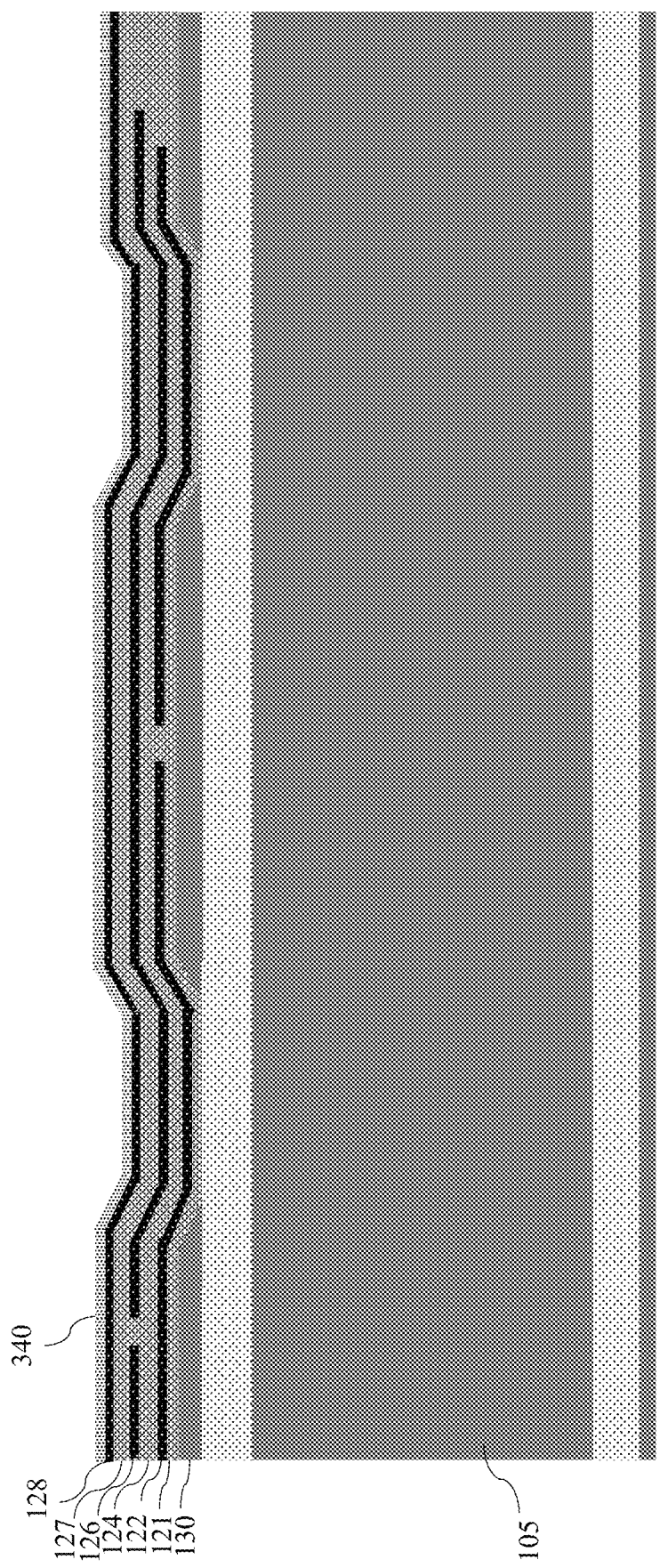

A piezoelectric layer 124 may be deposited over the substrate 105, as illustrated in FIG. 3D. The piezoelectric layer 124 may have a thickness ranging from about 100 nm to about 1000 nm, in a non-limiting example. In various non-limiting embodiments, a second electrode layer 126 may be deposited over the piezoelectric layer 124. The second electrode layer 126 may have a thickness ranging from about 20 nm to about 200 nm, in a non-limiting example. As illustrated in FIG. 3E, the second electrode layer 126 may be patterned, for example, using mask and etch techniques to form a top electrode or middle electrode of the piezoelectric stack portion. In various non-limiting embodiments, a further piezoelectric layer 127 may be deposited over the second electrode layer 126, and a further electrode layer 128 may be deposited over the further piezoelectric layer 127. The further piezoelectric layer 127 may have a thickness ranging from about 100 nm to about 1000 nm, in a non-limiting example. The further electrode layer 128 may have a thickness ranging from about 20 nm to about 200 nm, in a non-limiting example. The further electrode layer 128 may be patterned, for example, using mask and etch techniques to form a top electrode of the piezoelectric stack portion in the case the second electrode layer 126 serves as the middle electrode. The further piezoelectric layer 127 and the further electrode layer 128 may be optional depending on the design of the piezoelectric stack portion and may not be required in some embodiments. As illustrated, the layers of the piezoelectric stack portion may have a profile which is conformal to the profile of the mechanical portion 130. A passivation layer 340 may be deposited over the layers of the piezoelectric stack portion. The passivation layer 340 may be used to protect the electrode in the piezoelectric stack portion (e.g., top electrode) during and after the device release process. The passivation layer 340 may be, or include, AlN, silicon nitride, polysilicon, aluminum, titanium nitride, etc., in a non-limiting example. The passivation layer 340 may have a thickness ranging from about 20 nm to about 200 nm, in a non-limiting example. In various non-limiting embodiments, a sacrificial layer such as a TEOS layer, in a non-limiting example, may be formed over the passivation layer 340 to protect the passivation layer 340 before the device release process (not shown). The sacrificial layer over the passivation layer 340 may be removed during the device release. The sacrificial layer may have a thickness ranging from about 20 nm to about 200 nm, in a non-limiting example. In other embodiments, the sacrificial layer may not be required.

Figure 3G:
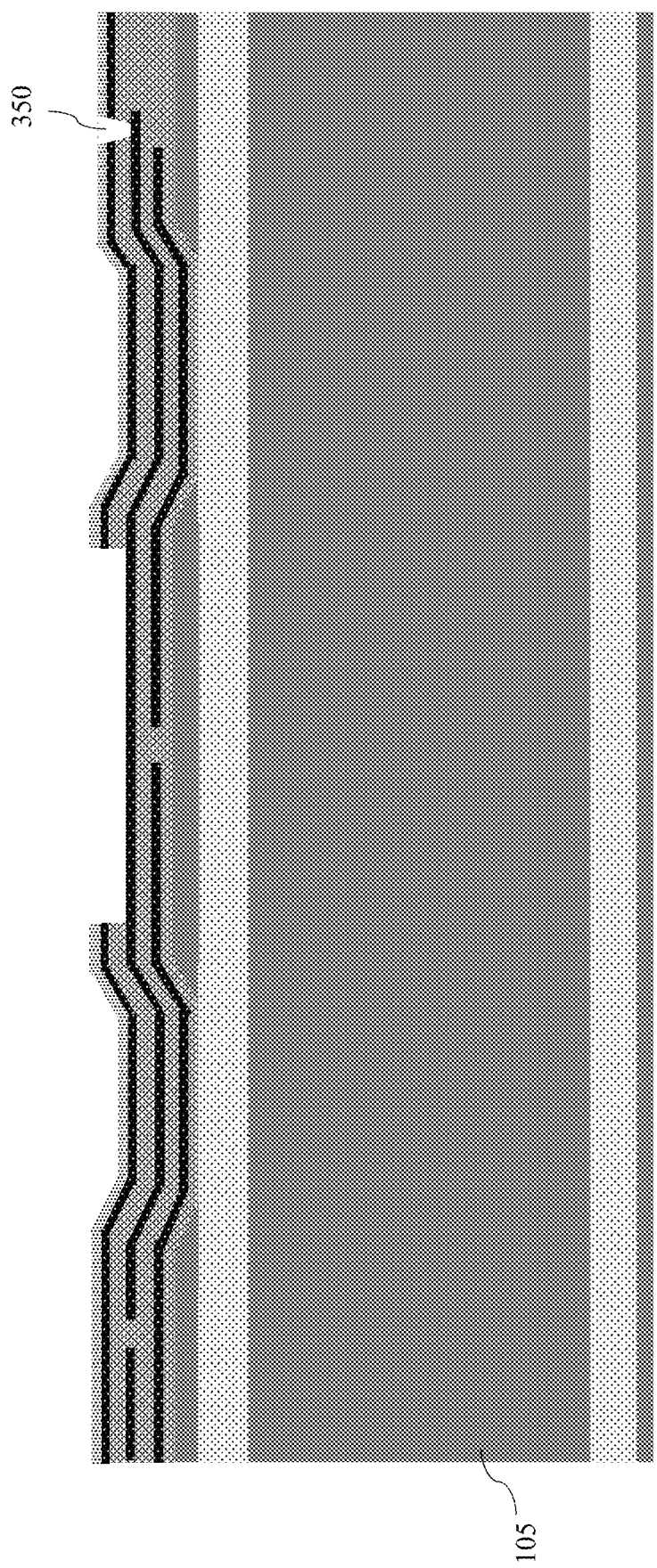
Figure 3H:
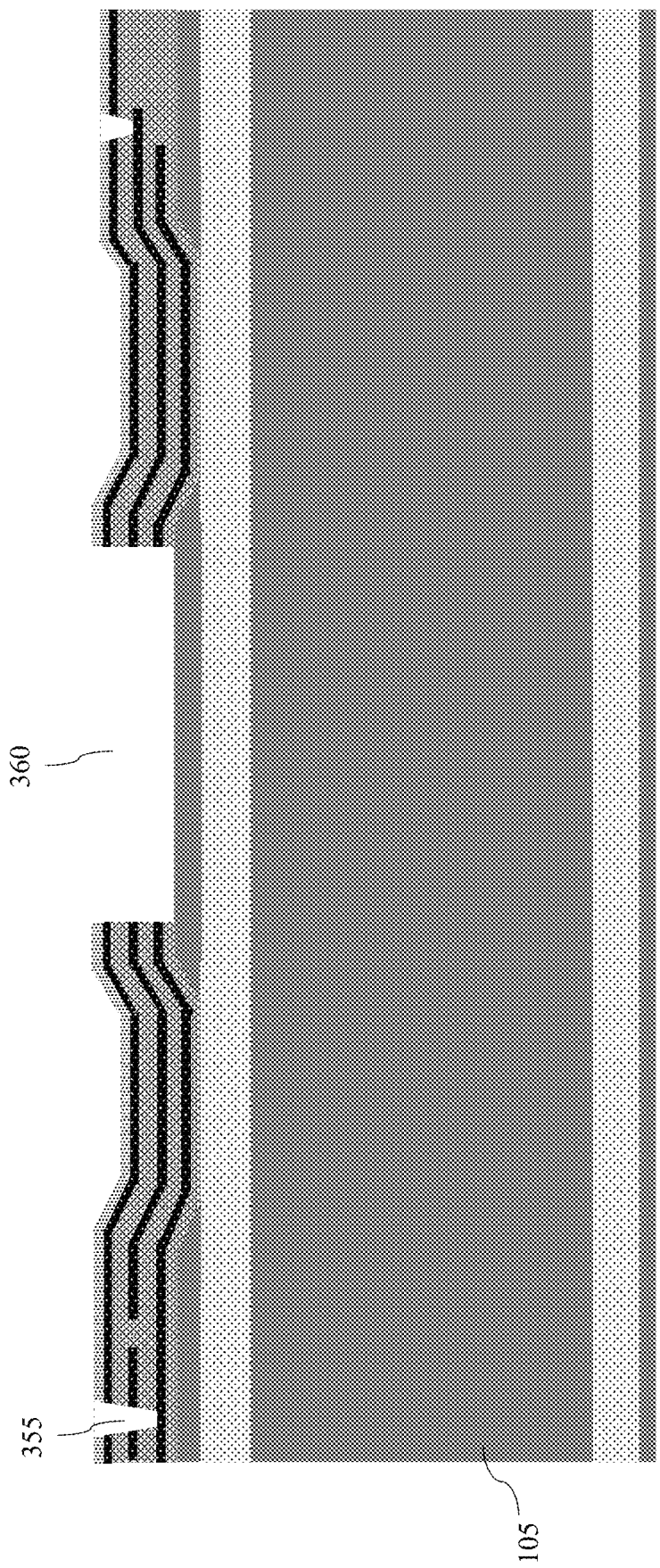

A first via opening 350 may formed in the piezoelectric stack portion, as illustrated in FIG. 3G. For example, the first via opening 350 may be patterned by a mask and etch technique, using the second electrode layer 126 as an etch stop layer. A second via opening 355 may be formed in the piezoelectric stack portion, as illustrated in FIG. 3H. For example, the second via opening 355 may be patterned by a mask and etch technique, using the first electrode layer 122 as an etch stop layer. In various non-limiting embodiments, an opening 360 may be formed in the center of the piezoelectric stack portion. For example, the opening 360 may be formed simultaneously during patterning of the second via opening 355 (e.g., higher etch rate at a bigger pattern for forming opening 360). The patterning for the opening 360 may stop upon reaching the mechanical portion. The process continues with patterning of the piezoelectric stack portion to form an opening for a bond pad (not shown).

A conductive layer may be deposited over the substrate 105 to form a bond pad and interconnect. The conductive layer may have a thickness ranging from about 100 nm to about 1000 nm, in a non-limiting example. The conductive layer may be Al, in a non-limiting example. The conductive layer may be patterned to form a bond pad 370 and interconnect 372.

Figure 3I:
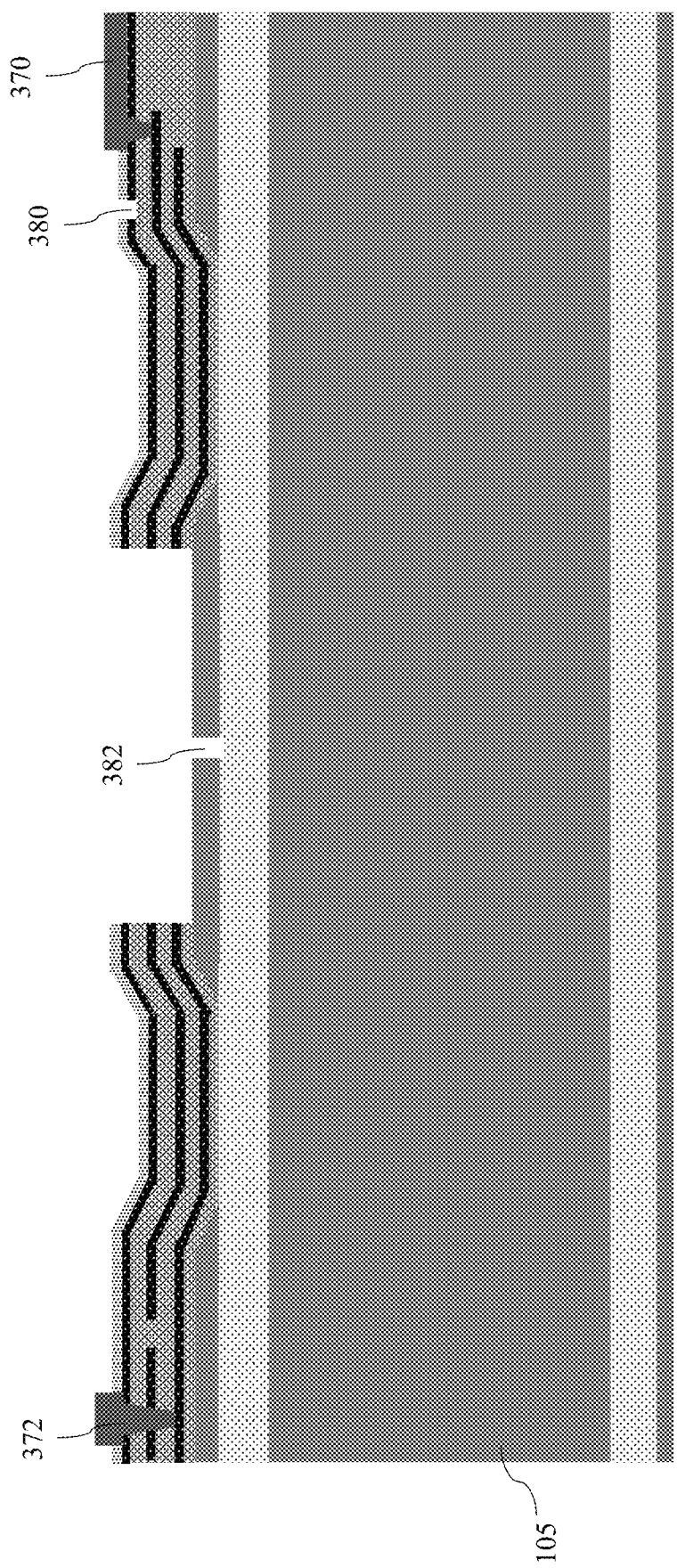

The process then continues to pattern the top electrode (e.g., denoted by a gap 380) of the piezoelectric stack portion depending on the design and electrical connection of the top electrode, as illustrated in FIG. 3I. In various non-limiting embodiments, the mechanical portion 130 of the hybrid active structure may be further patterned. For example, in the case the hybrid active structure serves as a plurality of cantilevers, the mechanical portion 130 may be patterned to form a gap 382.

Figure 3J:
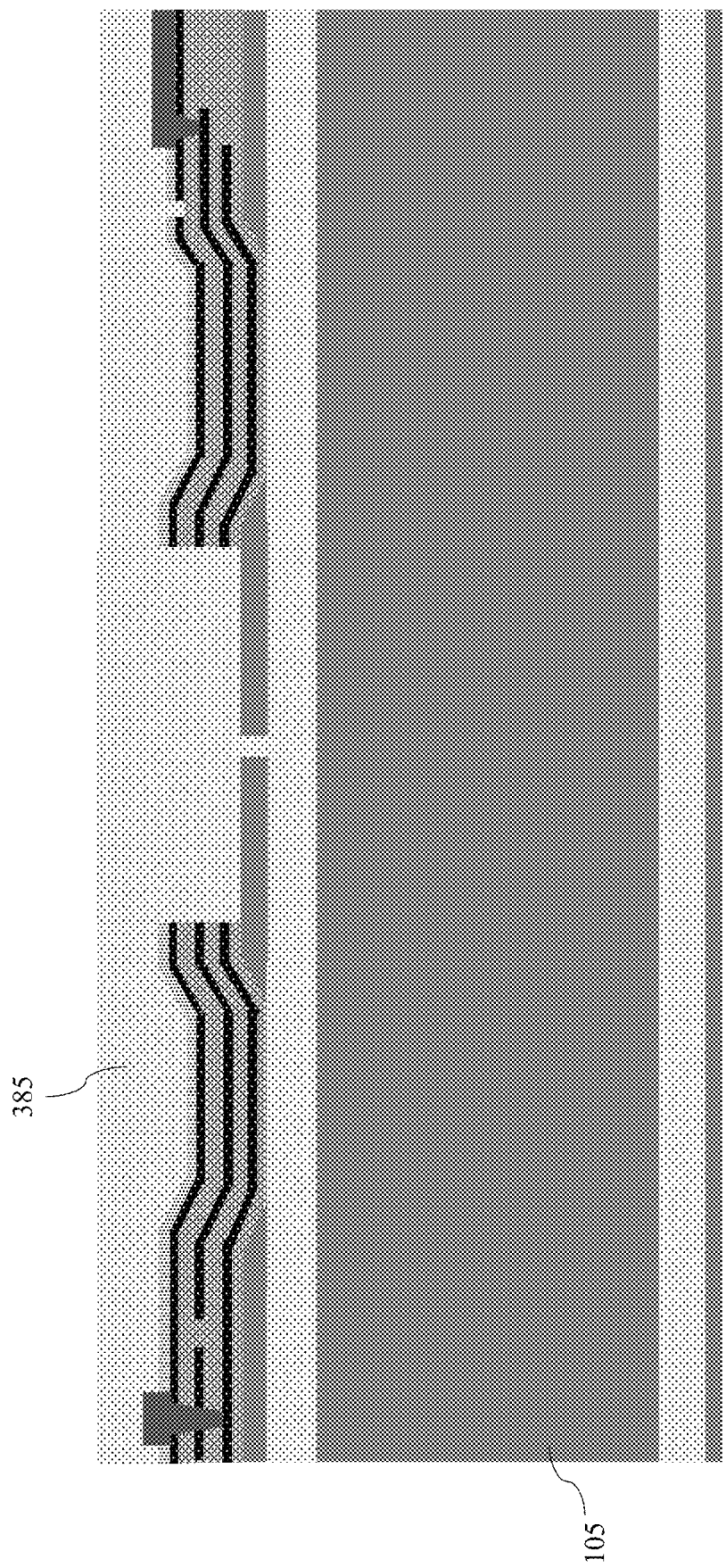
Figure 3K:
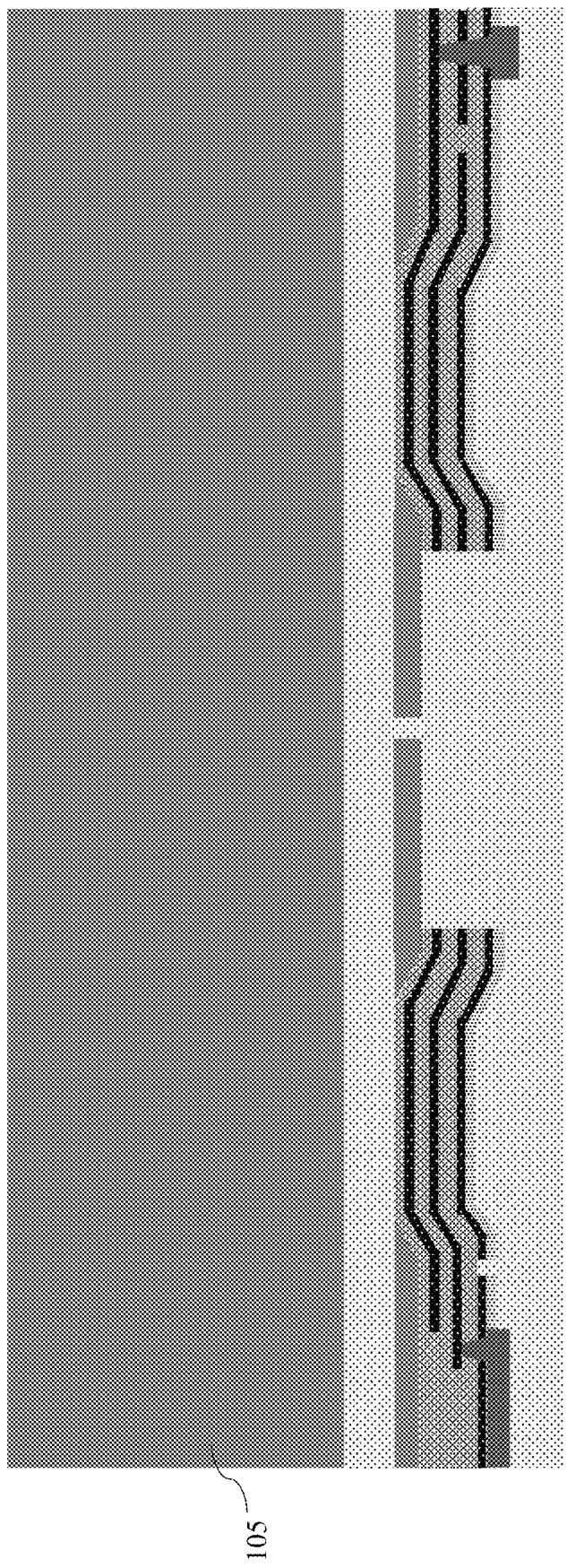

In various non-limiting embodiments, a cavity may be formed in the substrate 105 below the hybrid active structure. As illustrated in FIG. 3J, a protective layer 385 may be deposited over the substrate 105 to protect the piezoelectric stack portion and for wafer bow control prior to forming the cavity. In a non-limiting example, the protective layer 385 may be a thick oxide layer. For example, the protective layer 385 may have a thickness ranging from about 500 nm to about 5000 nm. The substrate may be then flipped over for backgrinding a bottom surface of the substrate in the backgrinding is required. Backgrinding may be optional depending on any packaging requirements. For example, the substrate 105 may be backgrinded to a final thickness of about 200 um to about 600 um.

Figure 3L:
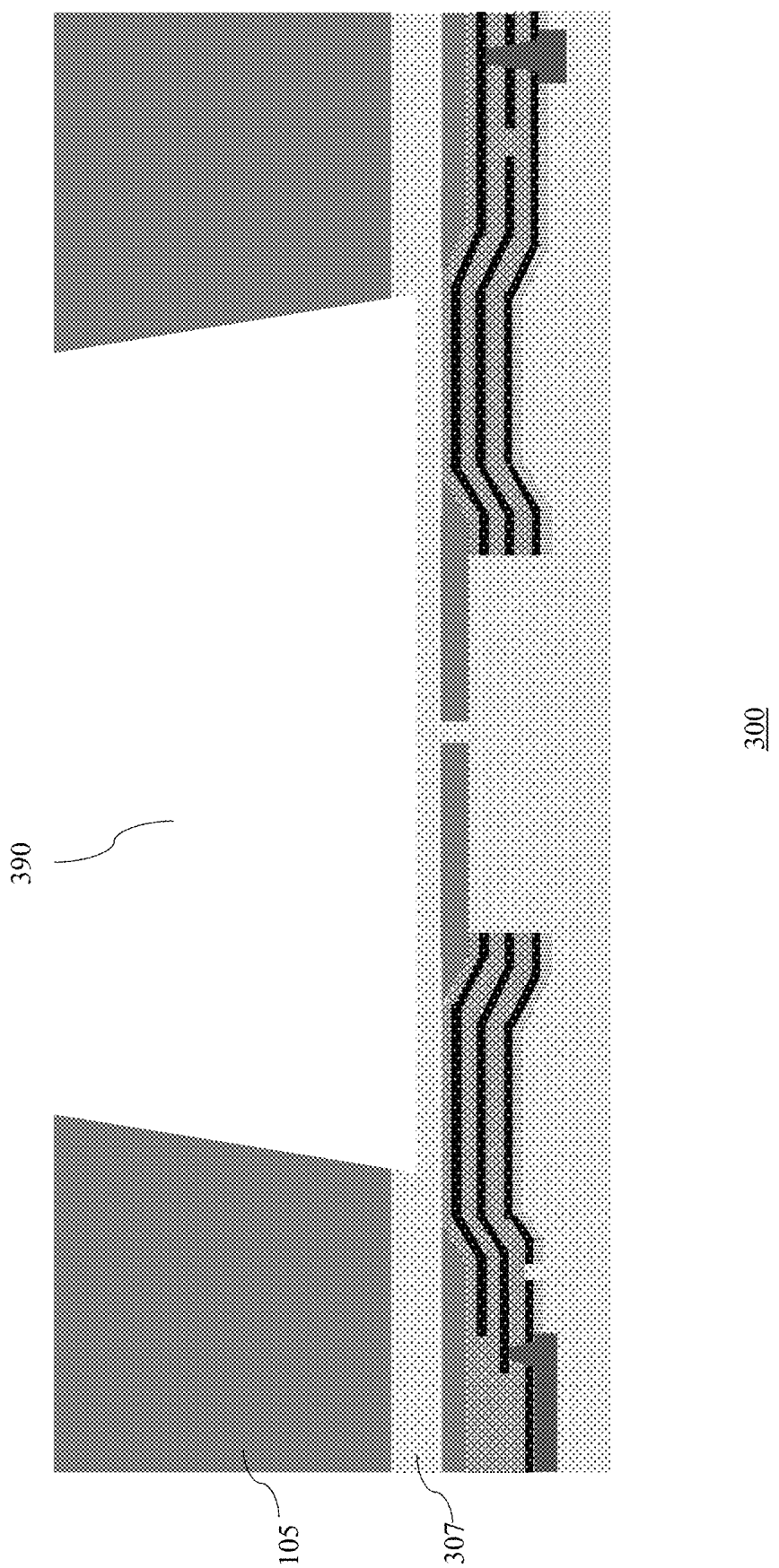

The substrate 105 may be patterned to form a cavity 390, as illustrated in FIG. 3L. The cavity 390 may be formed by patterning the bottom surface of the substrate using mask and etch techniques. For example, a patterned hard mask may be used to expose an area of the substrate corresponding to the cavity to be formed and the substrate may be etched by a deep reactive-ion etching (DRIE) to form the cavity 390. The sacrificial layer 307 may be used as etch stop layer for the etching. In other embodiments, the MEMS device may be fabricated without forming the cavity below the hybrid active structure. For example, the process steps as described with respect to FIGS. 3J-3L may not be required.

Figure 3M:
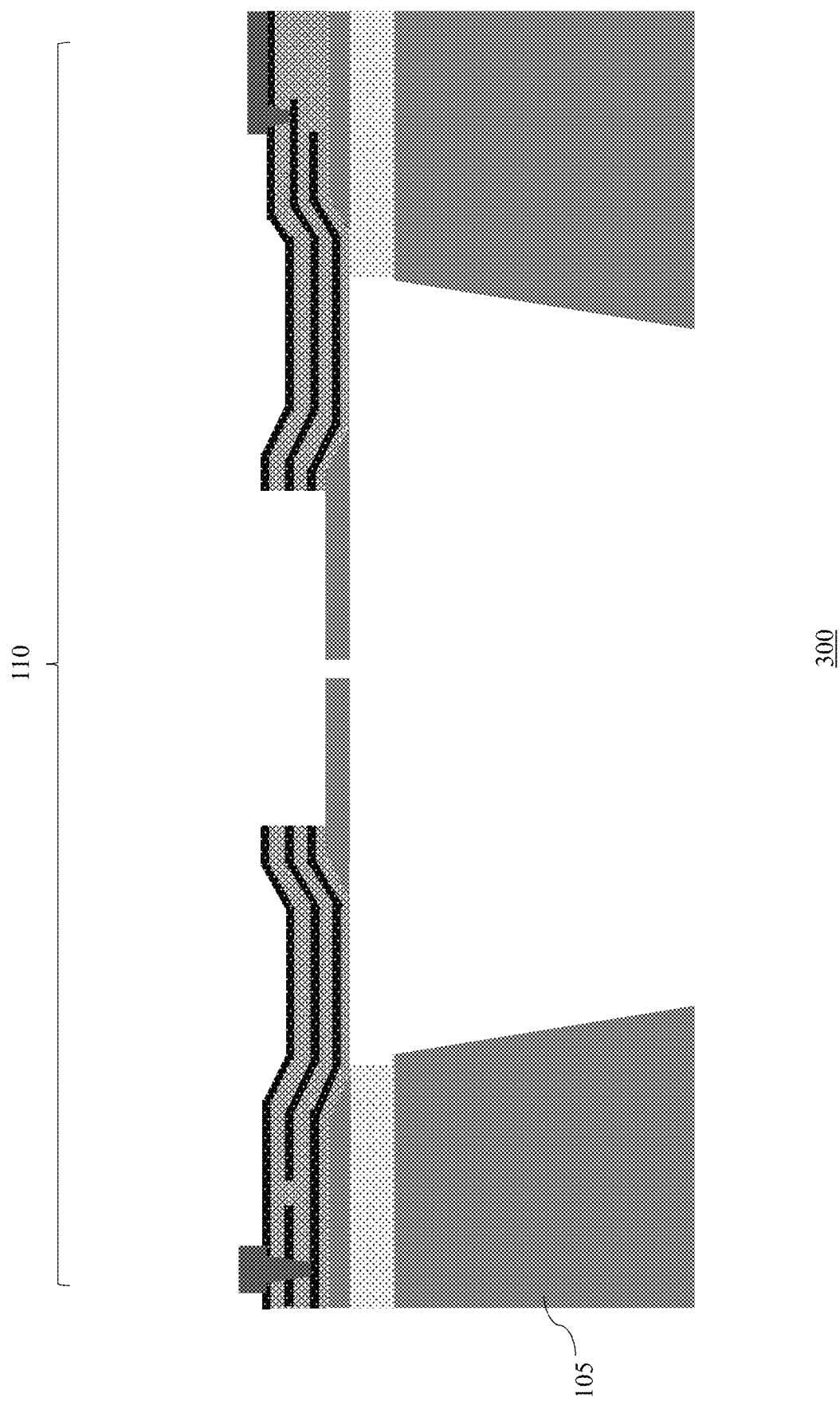

A release etch process may be performed to release the hybrid active structure 110 of the MEMS device. The release etch process may be a vapor release etch (e.g., using HF etching) to remove a portion of the sacrificial layer 307 exposed by the cavity 390, releasing the hybrid active structure 110 over the substrate as illustrated in FIG. 3M.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A microelectromechanical (MEMS) device comprising:
   a substrate with a cavity;
   a hybrid active structure disposed over the substrate and the cavity, the hybrid active structure having an anchor region and a free region, wherein the hybrid active structure is connected to the substrate at least at the anchor region, and wherein the hybrid active structure comprises:
   a mechanical portion, including a first mechanical portion segment in the anchor region and a second mechanical portion segment in the free region, the first and second mechanical portion segments being separate from each other; and
   a piezoelectric stack portion for generating electrical signal by piezoelectric effect, wherein the piezoelectric stack portion comprises a first electrode layer, a piezoelectric layer over the first electrode layer, and a second electrode layer over the piezoelectric layer;
   wherein the piezoelectric stack portion has a first piezoelectric stack segment overlapping the first mechanical portion segment, a second piezoelectric stack segment overlapping the second mechanical portion segment, and a third piezoelectric stack segment between the first and second piezoelectric stack segments, the third piezoelectric stack segment being exposed to the cavity.

2. The MEMS device of claim 1, wherein the piezoelectric stack portion further comprises a seed piezoelectric layer disposed under the first electrode layer, wherein the seed piezoelectric layer contacts the mechanical portion.

3. The MEMS device of claim 1, wherein the first electrode layer contacts the mechanical portion.

4. The MEMS device of claim 1, wherein the hybrid active structure is a cantilevered beam, wherein the second mechanical portion segment is exposed to the cavity and directly connected to only the piezoelectric stack portion and forms a free end of the cantilevered beam.

5. The MEMS device of claim 1, wherein the hybrid active structure is a cantilevered beam, and the hybrid active structure comprises the piezoelectric stack portion connected to the substrate at the anchor region and a second piezoelectric stack portion respectively connected to the substrate at a second anchor region, wherein the second mechanical portion segment is disposed in between the piezoelectric stack portion and the second piezoelectric stack portion.

6. The MEMS device of claim 1, wherein the anchor region further comprises via contacts disposed through the piezoelectric stack portion, wherein the via contacts electrically connect the first electrode layer and the second electrode layer.

7. The MEMS device of claim 1, wherein the second piezoelectric stack segment overlaps the second mechanical portion segment in the free region in a range from about 1 um to about 50 um.

8. The MEMS device of claim 1, wherein the third piezoelectric stack segment separates the first mechanical portion segment and the second mechanical portion segment.

9. The MEMS device of claim 1, wherein an edge of the second mechanical portion segment in an overlap region with the second piezoelectric stack segment of the hybrid active structure has a sloped portion with an angled profile and a substantially flat portion with a substantially flat profile.

10. The MEMS device of claim 9, wherein the sloped portion with the angled profile is in a range from about 5° to about 45° with respect to the substantially flat portion.

11. The MEMS device of claim 1, wherein the hybrid active structure is a membrane, wherein the second mechanical portion segment forms a center of the membrane.

12. The MEMS device of claim 11, wherein the hybrid active structure forms a diaphragm of an acoustic sensor.

13. A method of forming a MEMS device, comprising:
providing a substrate with a cavity; and
arranging a hybrid active structure over the substrate and the cavity, the hybrid active structure having an anchor region and a free region, wherein the hybrid active structure is connected to the substrate at least at the anchor region, and wherein the hybrid active structure comprises:
a mechanical portion, including a first mechanical portion segment in the anchor region and a second mechanical portion segment in the free region, the first and second mechanical portion segments being separate from each other; and
a piezoelectric stack portion for generating electrical signal by piezoelectric effect, wherein the piezoelectric stack portion comprises a first electrode layer, a piezoelectric layer over the first electrode layer, and a second electrode layer over the piezoelectric layer;
wherein the piezoelectric stack portion has a first piezoelectric stack segment overlapping the first mechanical portion segment, a second piezoelectric stack segment overlapping the second mechanical portion segment, and a third piezoelectric stack segment between the first and second piezoelectric stack segments, the third piezoelectric stack segment being exposed to the cavity.

14. The method of claim 13, wherein the piezoelectric stack portion further comprises a seed piezoelectric layer arranged under the first electrode layer, wherein the seed piezoelectric layer contacts the mechanical portion.

15. The method of claim 13, wherein the first electrode layer contacts the mechanical portion.

16. The method of claim 13, wherein an edge of the second mechanical portion segment in an overlap region with the second piezoelectric stack segment of the hybrid active structure has a sloped portion with an angled profile and a substantially flat portion with a substantially flat profile.

17. The method of claim 13, wherein the hybrid active structure is a cantilevered beam, wherein the second mechanical portion segment is exposed to the cavity and directly connected to only the piezoelectric stack portion and forms a free end of the cantilevered beam.

18. The method of claim 13, wherein the hybrid active structure is a cantilevered beam, and the hybrid active structure comprises the piezoelectric stack portion connected to the substrate at the anchor region and a second piezoelectric stack portion connected to the substrate at a second anchor region, wherein the second mechanical portion segment is formed between the piezoelectric stack portion and the second piezoelectric stack portion.

19. The method of claim 13, wherein the hybrid active structure is a membrane, wherein the second mechanical portion segment forms a center of the membrane.

20. The method of claim 13, further comprising forming via contacts in the anchor region, wherein the via contacts electrically connect the first electrode layer and the second electrode layer of the piezoelectric stack portion.

* * * * *